(12) United States Patent
Park (10) Patent No.: US 9,472,565 B2
(45) Date of Patent: Oct. 18, 2016

(54) NON-VOLATILE MEMORY DEVICE

(71) Applicant: SK hynix Inc., Gyeonggi-do (KR)

(72) Inventor: Sung-Kun Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/141,215

(22) Filed: Apr. 28, 2016

(65) Prior Publication Data

US 2016/0240544 A1    Aug. 18, 2016

Related U.S. Application Data

(62) Division of application No. 14/334,222, filed on Jul. 17, 2014, now Pat. No. 9,355,729.

(30) Foreign Application Priority Data

Feb. 11, 2014  (KR) ........................ 10-2014-0015404

(51) Int. Cl.
| | | |
|---|---|---|
| G11C 11/34 | (2006.01) | |
| H01L 27/115 | (2006.01) | |
| H01L 29/861 | (2006.01) | |
| H01L 23/535 | (2006.01) | |
| G11C 16/10 | (2006.01) | |
| G11C 16/26 | (2006.01) | |

(52) U.S. Cl.
CPC .......... *H01L 27/1157* (2013.01); *G11C 16/10* (2013.01); *G11C 16/26* (2013.01); *H01L 23/535* (2013.01); *H01L 29/861* (2013.01)

(58) Field of Classification Search
CPC ............. H01L 27/1157; H01L 29/861; H01L 23/535; G11C 16/10; G11C 16/26
USPC ................. 365/185.05, 185.26, 63
See application file for complete search history.

(56) References Cited

U.S. PATENT DOCUMENTS

| | | | | |
|---|---|---|---|---|
| 6,026,019 A * | 2/2000 | Lam | ................... | G11C 16/0433 257/296 |
| 6,528,842 B1 * | 3/2003 | Luich | .................. | H01L 29/7883 257/314 |
| 6,727,149 B1 * | 4/2004 | Krishnan | .......... | H01L 29/66772 257/E21.345 |
| 7,339,229 B2 * | 3/2008 | Wang | ................. | G11C 16/0433 257/315 |
| 7,508,027 B2 * | 3/2009 | Oberhuber | ............ | H01L 27/115 257/318 |
| 9,070,781 B2 * | 6/2015 | Park | ................... | H01L 29/42324 |
| 9,355,729 B2 * | 5/2016 | Park | ................... | H01L 29/42328 |
| 2005/0199936 A1 * | 9/2005 | Wang | ................. | G11C 16/0433 257/314 |
| 2007/0064494 A1 * | 3/2007 | Morton | .............. | G11C 16/0416 365/185.28 |
| 2009/0267127 A1 * | 10/2009 | Chen | ...................... | G11C 16/10 257/314 |
| 2010/0238738 A1 * | 9/2010 | Yoo | ....................... | H01L 27/115 365/185.29 |
| 2014/0293709 A1 * | 10/2014 | Kwon | ................ | G11C 16/0441 365/185.33 |
| 2014/0312405 A1 * | 10/2014 | Park | .................... | H01L 29/7881 257/316 |
| 2014/0367761 A1 * | 12/2014 | Park | .................... | H01L 29/42324 257/316 |
| 2015/0001608 A1 * | 1/2015 | Tan | ................... | H01L 29/42324 257/321 |

* cited by examiner

*Primary Examiner* — Viet Q Nguyen
(74) *Attorney, Agent, or Firm* — IP & T Group LLP (57) ABSTRACT

A non-volatile memory device includes: a floating gate having a plurality of fingers; a first coupling unit including an active control gate which overlaps with the floating gate in a vertical direction; a second coupling unit including a plurality of control plugs which overlap with the floating gate in a horizontal direction; and a control unit which electrically connects the active control gate to the control plugs and controls a bias to be applied to the active control gate.

5 Claims, 9 Drawing Sheets

NON-VOLATILE MEMORY DEVICE

CROSS-REFERENCE TO RELATED APPLICATIONS

This application is a division of U.S. patent application Ser. No. 14/334,222 filed on Jul. 17, 2014, which claims priority of Korean Patent Application No. 10-2014-0015404, filed on Feb. 11, 2014. The disclosure of each of the foregoing applications is incorporated herein by reference in its entirety.

BACKGROUND

1. Field

Exemplary embodiments of the present invention relate to a semiconductor device fabrication technology, and more particularly, to a non-volatile memory device.

2. Description of the Related Art

Recent digital media devices allow people to readily use information they want anywhere at any time. As various devices are converted from analog to digital and the digital devices are propagating rapidly, storage media are required for storing video, recorded music, and diverse data. As a result, global semiconductor industries are competitively making an investment in System on Chip ("SoC") foundation technology to keep pace with the trend of high integration. The SoC is a technology integrating all system technologies into a single semiconductor. Without system designing technology, it is difficult to develop a non-memory semiconductor. As chips having a complex function of both digital circuits and analog circuits emerge as mainstream technology in the SoC field, there is an increasing demand for an embedded memory that trims an analog device or stores an internal operation algorithm.

Since an embedded memory is fabricated based on a logic process or a complementary metal-oxide semiconductor ("CMOS") process for forming a logic circuit, it is difficult to improve the integration degree of the embedded memory.

SUMMARY

Exemplary embodiments of the present invention are directed to a non-volatile memory device having improved integration degree.

In accordance with an embodiment of the present invention, a non-volatile memory device includes: a floating gate having a plurality of fingers; a first coupling unit including an active control gate which overlaps with the floating gate in a vertical direction; a second coupling unit including a plurality of control plugs which overlap with the floating gate in a horizontal direction; and a control unit which electrically connects the active control gate to the control plugs and controls a bias applied to the active control gate.

In accordance with another embodiment of the present invention, a non-volatile memory device includes: an active control gate formed in a substrate; a floating gate having a plurality of fingers which are formed over the substrate and divided to overlap with the active control gate; a plurality of control plugs which are formed over the active control gate and disposed adjacent to the fingers with gaps between them; and a rectifier which electrically connects the active control gate to the control plugs and controls a bias to be applied to the active control gate.

In accordance with another embodiment of the present invention, a non-volatile memory device includes: a first well of a second conductive type which is formed over a substrate; a second well which is formed over the substrate and has a first conductive type in a complementary relationship to the second conductive type; a floating gate which is formed over the substrate, and overlaps with the first and second wells, and includes a plurality of fingers overlapping with the first well; a selection gate which is formed over the substrate and overlaps with the second well; a plurality of control plugs which are formed over the first well and are disposed adjacent to the fingers with gaps between them; spacers which are formed on the sidewalls of the floating gate and the selection gate and gap-fill the gap; and an impurity region of a second conductive type which is formed in the first well below the control plug and electrically connects the control plug to the first well.

DETAILED DESCRIPTION

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

In the drawings, a thicknesses and a distance of components are exaggerated compared to an actual physical thickness and interval for convenience of illustration. In the following description, detailed explanation of known related functions and constitutions may be omitted to avoid unnecessarily obscuring the subject manner of the present invention. Like reference numerals refer to like elements throughout the specification and drawings.

Furthermore, 'connected/coupled' represents that one component is directly coupled to another component or indirectly coupled through another component. In this specification, a singular form may include a plural form as long as it is not specifically mentioned in a sentence. Furthermore, 'include/comprise' or 'including/comprising' used in the specification represents that one or more components, steps, operations, and elements exist or are added.

Described hereafter is a non-volatile memory device that may be easily applied to an embedded memory utilized in the field of System on Chip (SoC) technology integrating complicated technologies and may improve the integration degree of the embedded memory. To this end, the embodiments of the present invention provide a flash Electrically Erasable Programmable Read-Only Memory (EEPROM) that may be easily applied to an embedded memory. The flash EEPROM may store data even in the absence of power supply, and electrically erase and program data. The flash EEPROM includes a single gate EEPROM having one gate (e.g., a floating gate), a stack gate (ETOX) EEPROM where two gates (e.g., a floating gate and a control gate) are stacked vertically, a dual gate EEPROM, a split gate EEPROM and so on.

The single gate EEPROM has an advantage in that it may be fabricated based on a logic process without an additional process. However, a well structure occupying a large area, e.g., an active control gate (ACG), is required in order to secure a coupling ratio that a device requires. Also, the integration degree is low because a structure for programming and erasing data, e.g., a well structure, has to be implemented independently. On the contrary, since the stack gate EEPROM, the dual gate EEPROM and the split gate EEPROM may easily secure the coupling ratio that the device requires in comparison with the single gate EEPROM, the integration degree may easily increase. However, there are disadvantages in that productivity is low due to an additional process further requiring dozens of masks in addition to a predetermined logic process and it is difficult to apply to an embedded memory.

Therefore, the embodiments of the present invention are directed to a non-volatile memory device that may be fabricated based on a logic process without an additional process and that improves the integration degree. To improve the integration degree, the coupling ratio that the device requires has to be secured in a minimum area. To this end, the embodiments may include an active control gate (ACG) by which an electric field applies to a floating gate in a vertical direction and a control plug (CP) by which an electric field applies to the floating gate in a horizontal direction.

In the following description, a first conductive type and a second conductive type are in a complementary relationship to each other. That is, the second conductive type is an N-type when the first conductive type is a P-type, and the second conductive type is a P-type when the first conductive type is an N-type. This means that a non-volatile memory device in accordance with the embodiments of the present invention may have an N-channel type or a P-channel type. For the sake of convenience in description, it is presumed herein that the first conductive type is a P-type, and the second conductive type is an N-type. Hereafter, a non-volatile memory of an N-channel type is exemplarily described.

Figure 1:
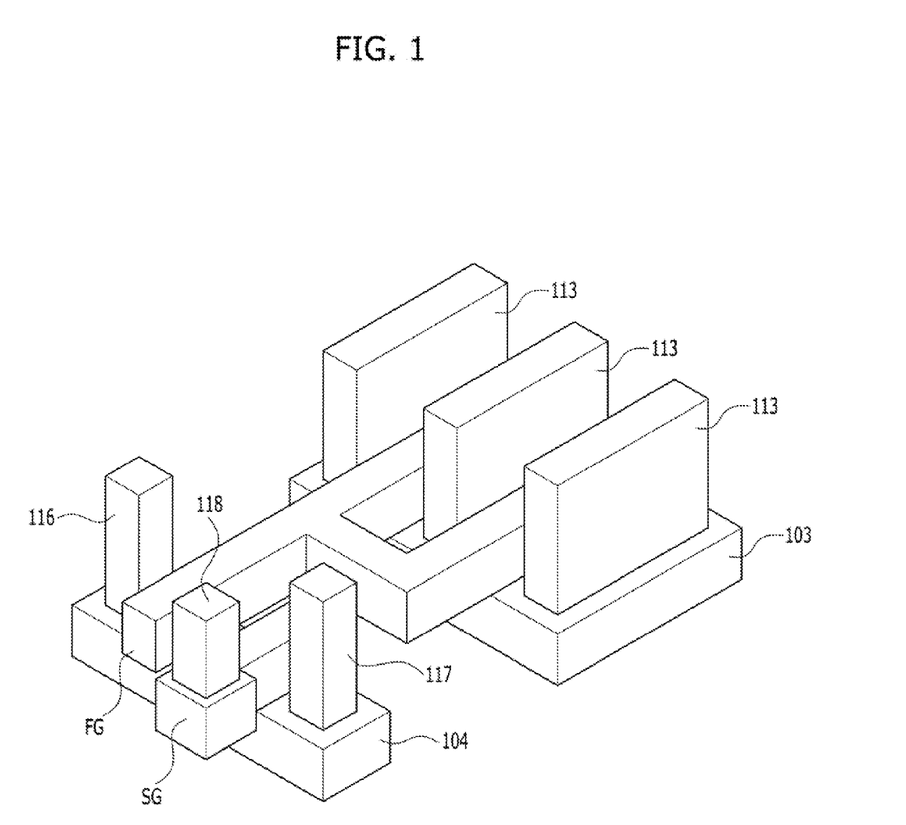
FIG. 1 is a perspective view illustrating a non-volatile memory device in accordance with an embodiment of the present invention.
Figure 2:
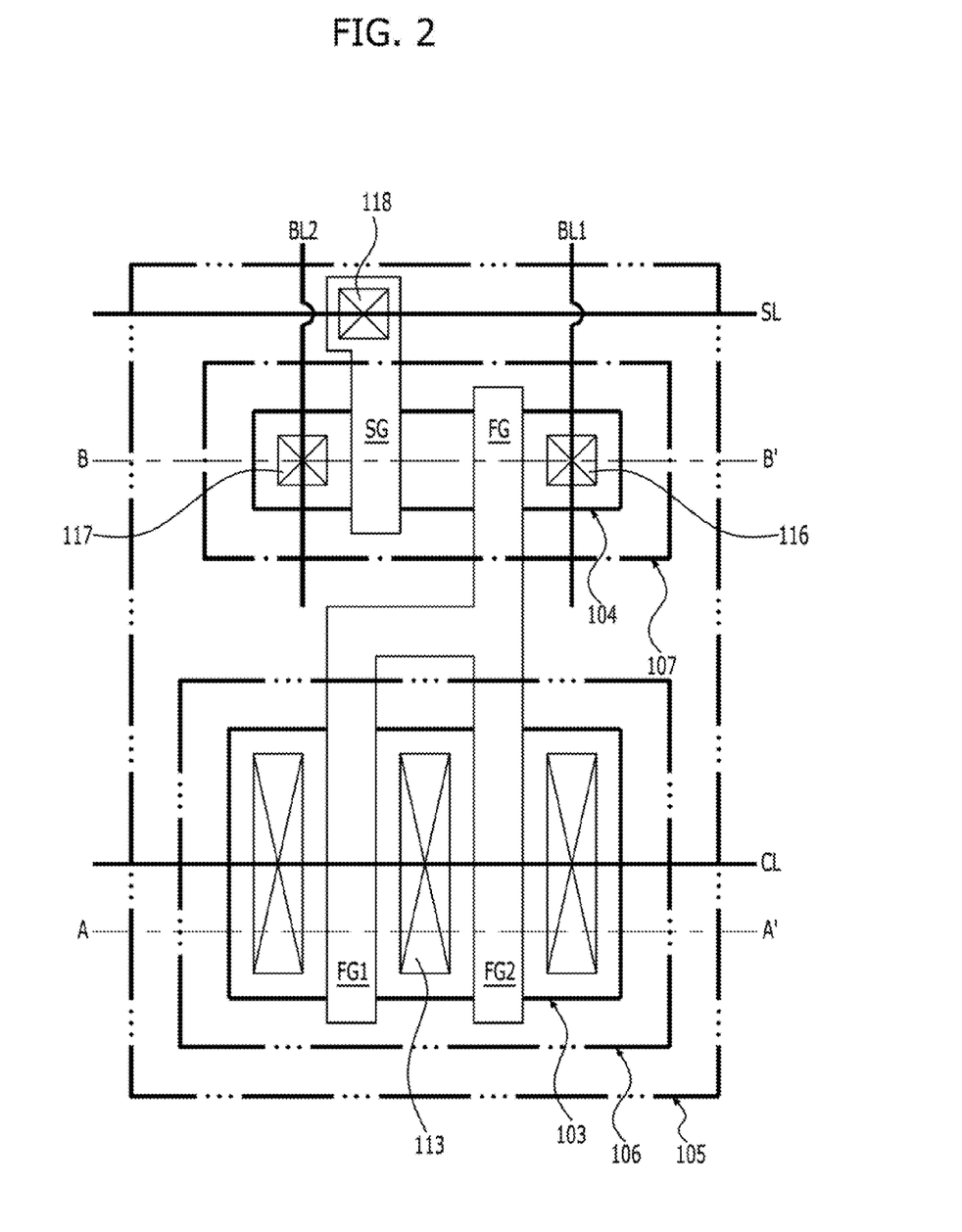
FIG. 2 is a plan view illustrating the non-volatile memory device in accordance with the embodiment of the present invention.
Figure 3:
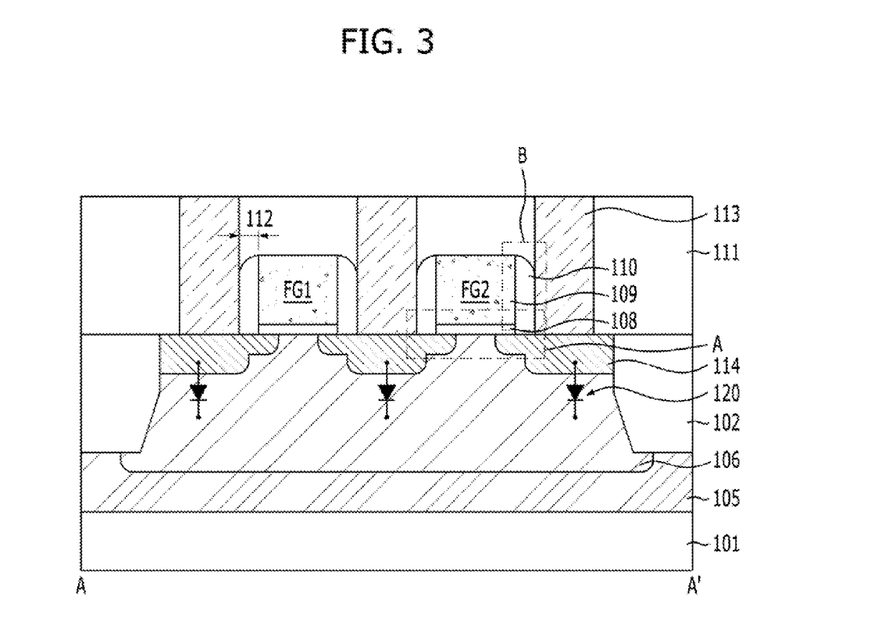
FIG. 3 is a cross-sectional view illustrating the non-volatile memory device taken along an A-A' line shown in FIG. 2.
Figure 4:
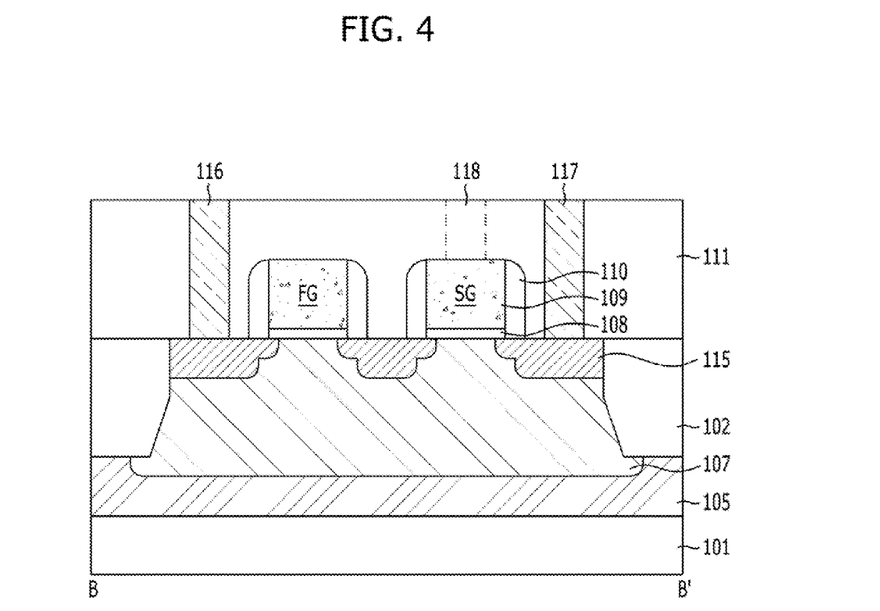
FIG. 4 is a cross-sectional view illustrating the non-volatile memory device taken along a B-B' line shown in FIG. 2.

FIGS. 1 to 4 illustrate a unit cell of a non-volatile memory device in accordance with an embodiment of the present invention. Specifically, FIG. 1 is a perspective view, and FIG. 2 is a plan view, and FIG. 3 is a cross-sectional view illustrating the non-volatile memory device taken along an A-A' line shown in FIG. 2 while FIG. 4 is a cross-sectional view illustrating the non-volatile memory device taken along a B-B' line shown in FIG. 2.

Referring to FIGS. 1 to 4, the non-volatile memory device in accordance with the embodiment of the present invention may include a floating gate FG which is formed over a substrate 101 and includes a plurality of fingers FG1 and FG2, a first coupling unit which is formed over the substrate 101 and uses an active control gate 106 overlapping with the fingers FG1 and FG2, a second coupling unit which is formed over the substrate 101 and uses a plurality of control plugs 113 disposed adjacent to the fingers FG1 and FG2 with a gap between them, and a control unit 120 which electrically connects the active control gate 106 to each of the control plugs 113 and controls a bias applied to the active control gate 106 through the control plug 113. The control unit 120 may include a diode. The diode may include a P-N junction diode.

Hereafter, detailed description on the components and configurations of the non-volatile memory device in accordance with the embodiment of the present invention is provided.

The non-volatile memory device in accordance with an embodiment of the present invention may include an isolation layer 102 which is formed in the substrate 101 and defines a first active region 103 and a second active region 104. The substrate 101 may be a semiconductor substrate. The semiconductor substrate may be of a single crystal state and contain a silicon-containing material. That is, the semiconductor substrate may include a single crystal silicon-containing material. For example, the substrate 101 may be a bulk silicon substrate or a silicon-on-insulator (SOI) substrate where a support substrate, a buried insulation layer and a single crystal silicon layer are sequentially stacked.

The isolation layer 102 may be formed through a shallow trench isolation (STI) process and include an insulation material. The first active region 103 and the second active region 104 which are defined by the isolation layer 102 may be disposed to be spaced apart from each other with a predetermined gap. The first active region 103 may correspond to a coupling region, and the second active region 104 may correspond to a tunneling region and a read region. That is, the first active region 103 may be a region for coupling the floating gate FG, and the second active region 104 may be a region for programming, erasing and reading data. Therefore, an area of the first active region 103 may be larger than an area of the second active region 104.

The non-volatile memory device in accordance with the embodiment of the present invention may include a deep well 105 of a second conductive type, e.g., a deep N-well, which is formed in the substrate 101, a first well 106 of the second conductive type, e.g., an –N-well, which is formed in the deep well 105 to correspond to the first active region 103, and a second well 107 of a first conductive type, e.g., a P-well, which is formed in the deep well 105 to correspond to the second active region 104. The first well 106 serves as the active control gate 106. Therefore, the first well and the active control gate have the same reference numeral "106". The deep well 105, the first well 106 and the second well 107 may be formed by ion-implanting an impurity into the substrate 101. The first well 106 and the second well 107 may be disposed to be spaced apart from each other with a predetermined gap or adjacent to each other on one side. When the first well 106 and the second well 107 are disposed adjacent to each other, junction isolation between them may occur due to a difference in conductive types.

The non-volatile memory device in accordance with the embodiment of the present invention may include the floating gate FG, a selection gate SG and sidewall spacers 110 formed on the sidewalls of the floating gate FG and the selection gate SG. The floating gate FG and the selection gate SG may be a stacked structure where a gate insulation layer 108 and a gate electrode 109 are stacked. The gate insulation layer 108 may be a single layer selected from the group consisting of an oxide layer, a nitride layer and an oxynitride layer, or a stacked layer thereof. The gate electrode 109 may include a silicon-containing material, e.g., a poly-silicon layer, and/or a metallic layer.

The floating gate FG stores logic information. The floating gate FG may overlap with the first active region 103 and the second active region 104. That is, the floating gate FG may overlap with the first well 106 and the second well 107. The floating gate FG may be extended from the second active region 104 to the first active region 103 over the second active region 104 and the first active region 103. The floating gate FG over the first active region 103 may include the divided fingers FG1 and FG2. That is, the floating gate FG may be a multi-finger type. Specifically, the floating gate FG may include the fingers FG1 and FG2 which are divided to overlap with the first well 106 corresponding to the first active region 103, i.e., the active control gate 106, in a vertical (i.e. substantially perpendicular) direction relative to the substrate 101. The fingers FG1 and FG2 increase a coupling ratio between the floating gate FG and the active control gate 106 by increasing an overlapping area between them. Also, the fingers FG1 and FG2 increase a coupling ratio between the floating gate FG and the control plugs 113 by increasing an overlapping area between them in a horizontal direction relative to the substrate 101.

The selection gate SG prevents over-erase of the non-volatile memory device. The selection gate SG may overlap with the second active region 104. The selection gate SG may be disposed to be spaced apart from one side of the floating gate FG with a predetermined gap. The selection gate SG may be formed simultaneously with the floating gate FG.

Each of the sidewall spacers 110 includes an insulation layer. For example, the sidewall spacer 110 may be a single layer selected from the group consisting of an oxide layer, a nitride layer and an oxynitride layer, or a stacked layer thereof. The sidewall spacers 110 formed on the sidewalls of the floating gate FG may serve as charge blocking layers. That is, the sidewall spacers 110 may block charges between the floating gate FG and the control plugs 113.

The non-volatile memory device in accordance with the embodiment of the present invention may include an inter-layer insulation layer 111 which covers over the structure including the floating gate FG and the selection gate SG, and a plurality of control plugs 113 which penetrate the inter-layer insulation layer 111 and are disposed adjacent to the floating gate FG with gaps 112 between them. The gaps 112 between the floating gate FG and the control plugs 113 may be gap-filled with the sidewall spacers 110. The sidewall spacers 110 may serve as charge blocking layers. The inter-layer insulation layer 111 may be a single layer selected from the group consisting of an oxide layer, a nitride layer and an oxynitride layer, or a stacked layer thereof.

Each of the control plugs 113 couples the floating gate FG along with the active control gate 106. To this end, the control plug 113 may have one or more sidewalls facing the floating gate FG. For example, the control plug 113 may be disposed between the fingers FG1 and FG2. As areas of the sidewalls where the control plugs 113 and the floating gate FG face each other increase in a horizontal direction, a coupling ratio between them may increase. Also, the control plug 113 transfer a bias applied to the active control gate 106. To this end, the control plug 113 is disposed over the first active region 103 and may be electrically connected to the active control gate 106.

The non-volatile memory device in accordance with the embodiment of the present invention may include a first impurity region 114 of a first conductive type formed in the first active region 103 and a second impurity region 115 of a second conductive type formed in the second active region 104. The first impurity region 114 and the second impurity region 115 may be formed through an ion-Implantation process. The first impurity region 114 and the second impurity region 115 may have lightly doped drain (LDD) structures.

The first impurity region 114 may be formed in the first well 106 below the control plug 113 and overlap with the fingers FG1 and FG2. The first impurity region 114 may be electrically connected to the active control gate 106 and the control plug 113, and couples the floating gate FG. Also, the first impurity region 114 forms a P-N junction with the first well 106 and electrically connects the active control gate 106 to the control plugs 113. The first impurity region 114 may serve as a control unit 120 suitable for controlling a bias applied to the active control gate 106 through the control plugs 113. The control unit 120 may include a diode consisting of the first well 106 and the first impurity region 114. An anode of the diode may be coupled with the control plugs 113, and a cathode of the diode may be coupled with the active control gate 106.

A memory device which couples the floating gate FG by using the active control gate 106 has to use just one control plug 113 between a positive bias and a negative bias. Since the non-volatile memory device in accordance with the embodiment of the present invention includes both of the control plugs 113 capable of coupling the floating gate FG other than the active control gate 106 and the control unit 120 capable of applying selectively a bias to the active control gate 106, the non-volatile memory device may be free of a polarity of the bias applied to memory cells in order to couple the floating gate FG.

The second impurity region 115 may be formed in the second well 107 on one side of the floating gate FG, on the other side of the selection gate SG, and between the floating gate FG and the selection gate SG. The second impurity region 115 may serve as a junction region, i.e., a source region and a drain region. The second impurity region 115 formed between the floating gate FG and the selection gate SG may couple a channel by the floating gate FG with a channel by the selection gate SG.

The non-volatile memory device in accordance with the embodiment of the present invention may include a first contact plug 116 which is coupled with the second impurity region 115 disposed adjacent to the floating gate FG by penetrating the inter-layer insulation layer 111, a second contact plug 117 which is coupled with the second impurity region 115 disposed adjacent to the selection gate SG, and a third contact plug 118 which is coupled with the selection gate SG. The first to third contact plugs 116 to 118 may be formed simultaneously with the control plugs 113.

The non-volatile memory device in accordance with the embodiment of the present invention may include a control line CL which is formed over the inter-layer insulation layer 111 and is coupled with the control plugs 113, a first bit line BL1 which is coupled with the first contact plug 116, a second bit line BL2 which is coupled with the second contact plug 117, and a selection line SL which is coupled with the third contact plug 118. The control line CL and the selection line SL may be disposed on the same plane in parallel with each other. The first bit line BL1 and the second bit line BL2 may be disposed on the same plane in parallel with each other. The control line CL and the selection line SL may intersect with the first bit line BL1 and the second bit line BL2, and be disposed on different planes. That is, the control line CL and the selection line SL may have a multi-layer interconnection structure with the first bit line BL1 and the second bit line BL2.

As the non-volatile memory device having the aforementioned structure includes the first coupling unit having the active control gate 106 by which an electric field applies to the floating gate FG in a vertical direction and the second coupling unit including the control plugs 113 by which an electric field applies to the floating gate FG in a horizontal direction, a coupling ratio that the device requires may be secured in a minimum area. As a result, the Integration degree of the device may improve.

As the coupling ratio that the device requires is secured, a structure, e.g., a well structure, for programming, erasing and reading data may be simplified, and the integration degree of the device may further improve.

Hereafter, an example of a method for operating the non-volatile memory device in accordance with the embodiment of the present invention is described with reference to the accompanying FIG. 5 and Table 1 along with FIGS. 1 to 4.

Figure 5:
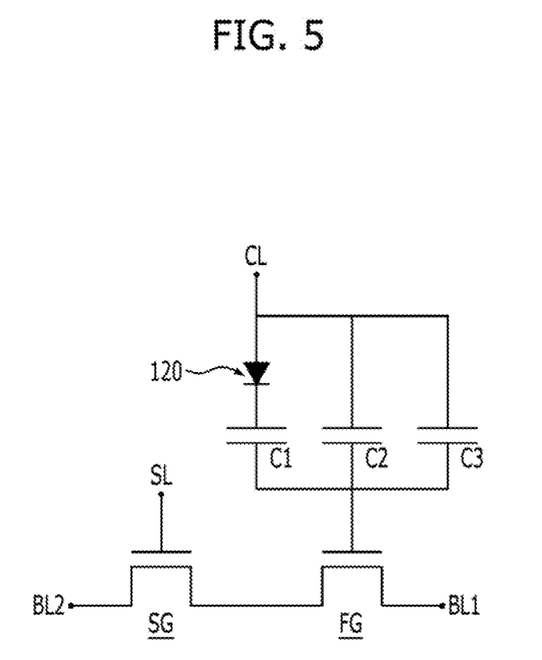
FIG. 5 illustrates an equivalent circuit diagram of the non-volatile memory device in accordance with the embodiment of the present invention.

FIG. 5 is an equivalent circuit diagram of the non-volatile memory device in accordance with the embodiment of the present invention.

Referring to FIG. 5, the non-volatile memory device in accordance with the embodiment of the present invention may include a first to third capacitors C1, C2 and C3 having an influence on the coupling of the floating gate FG. The first capacitor C1 which is formed of the active control gate 106 overlapping with the floating gate FG in a vertical direction may correspond to the first coupling unit. The second capacitor C2 which is formed of the control plugs 113 overlapping with the floating gate FG in a horizontal direction may correspond to the second coupling unit. The third capacitor C3, which is formed of the first impurity region 114 overlapping with the floating gate FG in a vertical direction, may be formed of the control unit 120. The coupling ratio of the floating gate FG is influenced by capacitances of the first to third capacitors C1, C2 and C3, and is proportional to those areas.

The control unit 120 which couples the control plug 113 with the active control gate 106 and controls a bias applied to the active control gate 106 through the control plug 113 may include a diode by which an anode and a cathode may be coupled with the control plug 113 and the active control gate 106, respectively. The capacitances having an influence on the coupling ratio of the floating gate FG during a program operation and an erase operation based on the control unit 120, may be different from each other. Specifically, the floating gate FG may be coupled by the first and second capacitors C1 and C2 during the program operation. Also, the floating gate FG may be coupled by the second and third capacitors C2 and C3 during the erase operation.

The non-volatile memory device in accordance with the embodiment of the present invention may apply a hot carrier injection (HCI) scheme or a Fowler-Nordheim (FN) tunneling scheme to the program operation and it may apply a band-To-band tunneling (BTBT) scheme or the Fowler-Nordheim (FN) tunneling scheme to the erase operation. Hereafter, an example of an operation condition of the non-volatile memory device in accordance with the embodiment of the present invention is described with reference to the following Table 1. Table 1 illustrates a case where the FN tunneling scheme is applied during the program operation and the erase operation. The FN tunneling scheme requires a higher coupling ratio of the floating gate FG than the HCI scheme and the BTBT scheme. That is, an operation using the FN tunneling scheme may be performed when an adequate coupling ratio is secured.

TABLE 1

| Operation | | Program | Erase | Read |
|---|---|---|---|---|
| | Scheme | FN tunneling | FN tunneling | — |
| Control line | Active control gate | VPP | Floating | VCC |
| | Control plug | VPP | −VPP | VCC |
| | First impurity region | VPP | −VPP | VCC |
| | First bit line | Floating | Floating | Vread |
| | Second bit line | Floating | Floating | GND |
| Substrate (or Second well) | | −VPP | VPP | GND |

During the program operation, a pumping voltage VPP and a negative pumping voltage −VPP may be applied to the control line CL and the substrate 101, respectively, in a stage where the first bit line BL1 and the second bit line BL2 float. The pumping voltage VPP means a voltage which boosts a power supply voltage VCC.

The pumping voltage VPP applied to the control line CL is equally applied to the active control gate 106, the control plug 113 and the first impurity region 114. Since the same pumping voltage VPP is equally applied to the active control gate 106 and the first impurity region 114, the control unit 120, i.e., the third capacitor C3 formed of the first impurity region 114 does not have an influence on the coupling ratio of the floating gate FG during the program operation. That is, the floating gate FG may be coupled by the first and second capacitors C1 and C2 during the program operation. Since the control unit 120, i.e., a diode is turned on in a forward direction as the pumping voltage VPP is applied to the control line CL, the floating gate FG may be coupled by the first capacitor C1.

During the erase operation, a negative pumping voltage −VPP and a pumping voltage VPP may be applied to the control line CL and the substrate 101, respectively, in a stage where the first bit line BL1 and the second bit line BL2 float.

The negative pumping voltage −VPP applied to the control line CL is not applied to the active control gate 106 and is applied just to the control plug 113 and the first impurity region 114. The control unit 120, i.e., a diode is turned off in a reverse direction and the first capacitor C1 floats as the negative pumping voltage −VPP is applied to the control line CL. Therefore, the floating gate FG may be coupled by the second and third capacitors C2 and C3 during the erase operation. Even though the active control gate 106 is used during the erase operation, the coupling ratio that the device requires may be provided for the erase operation.

During the read operation, a read voltage Vread and a ground voltage GND may be applied to the first bit line BL1 and the second bit line BL2, respectively, when a power supply voltage VCC is applied to the control line CL. In some cases, the read voltage Vread may be applied to the second bit line BL2, and the ground voltage GND may be applied to the first bit line BL1.

As described above, as the non-volatile memory device secures the coupling ratio that the device requires, the diversity of the operation schemes may be secured, and the operation characteristic may improve. As the adequate coupling ratio is secured, the Hot Carrier Injection (HCI) scheme, the Band-To-Band Tunneling (BTBT) scheme and the Fowler-Nordheim (FN) tunneling scheme may be used during the program operation and the erase operation. Therefore, an advantage of each operation scheme may be selectively used.

Moreover, since the non-volatile memory device is free of a polarity of a bias used for coupling the floating gate FG as the control unit 120 is formed, the size of a peripheral circuit which applies the bias to memory cells may be reduced, and a variety of operation schemes may be easily applied.

Figure 6:
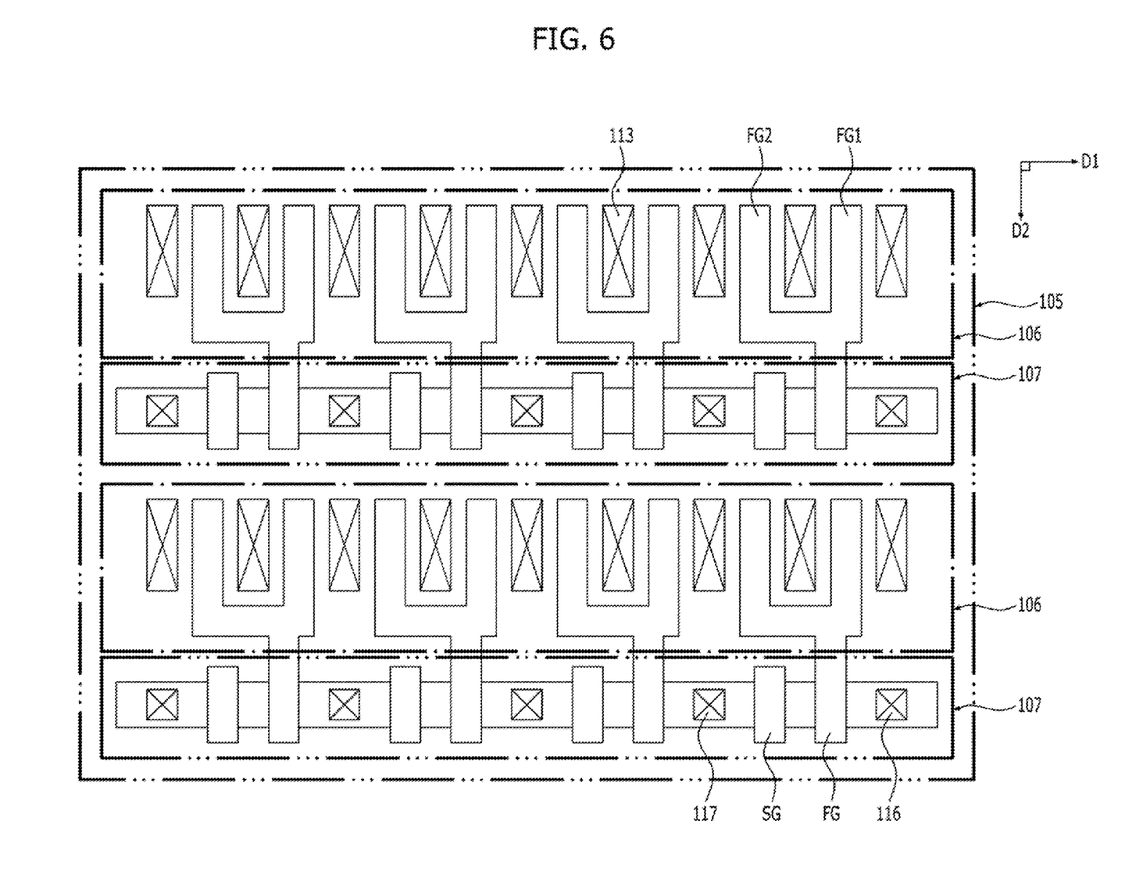
FIG. 6 is a plan view illustrating a cell array of the non-volatile memory device in accordance with another embodiment of the present invention.

FIG. 6 is a plan view illustrating a cell array of the non-volatile memory device in accordance with another embodiment of the present invention. A cell array includes a plurality of unit cells that are arrayed. The cell array, which is to be described below, may include the unit cell of the non-volatile memory device in accordance with the embodiment of the present invention. For the sake of convenience in description, the following embodiment of the non-volatile memory device uses the same reference numerals appearing in FIGS. 1 to 4.

Referring to FIG. 6, first wells 106 and second wells 107 of line types which are extended in a first direction D1 are disposed in a deep well 105. The first wells 106 and the second wells 107 may be disposed alternately in a second direction D2. Floating gates FG which overlap with the first wells 106 and the second wells 107 and have a plurality of fingers FG1 and FG2 divided over the first wells 106 and selection gates SG which overlap with the second wells 107, are disposed in matrix shapes. A plurality of control plugs 113 are disposed over each of the first wells 106. The control plug 113 may be disposed between the fingers FG1 and FG2 in one unit cell. The control plug 113 may be disposed between the fingers FG1 and FG2 between unit cells disposed adjacent to each other. First contact plugs 116 and second contact plugs 117 may be disposed over the second wells 107 on one sides of the floating gates FG and the second wells 107 on the other sides of the selection gates SG, respectively. The adjacent unit cells may share the first contact plugs 116 and/or the second contact plugs 117 with each other.

Although not illustrated, control lines CL which are extended in the first direction D1 and coupled with the control plugs 113, bit lines BL which are extended in the second direction D2 and coupled with the first and second contact plugs 116 and 117, and selection lines SL which are extended in the first direction D1 and coupled with the selection gates SG may be disposed. The control lines CL and the selection lines SL may have multi-layer interconnection structures with the bit lines BL.

FIGS. 7A to 7D and FIGS. 8A to 8D are cross-sectional views illustrating a method for fabricating the non-volatile memory device in accordance with the embodiments of the present invention. FIGS. 7A to 7D are cross-sectional views illustrating the non-volatile memory device taken along an A-A' line shown in FIG. 2. FIGS. 8A to 8D are cross-sectional views illustrating the non-volatile memory device taken along a B-B' line shown in FIG. 2.

Figure 7A:
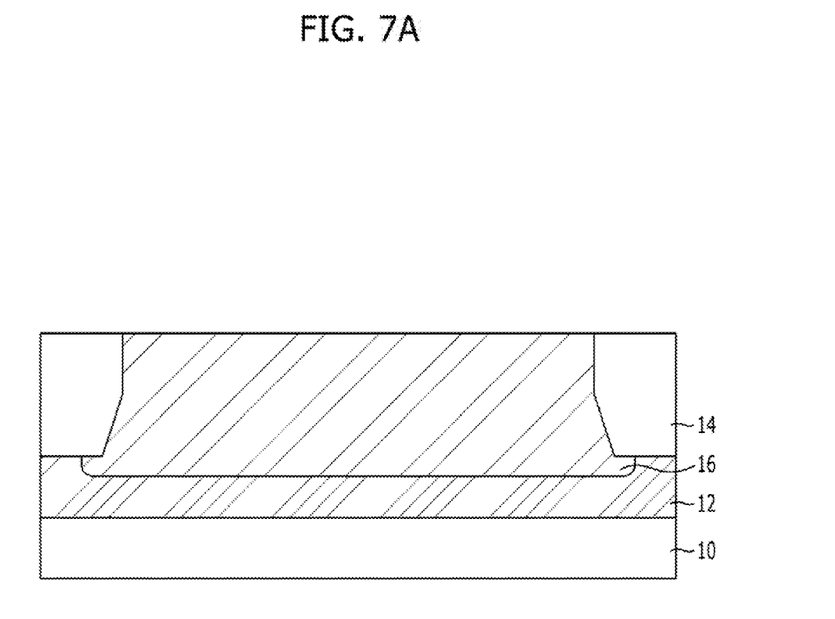
FIGS. 7A to 7D are cross-sectional views illustrating a method for fabricating the non-volatile memory device in accordance with the embodiments of the present invention.
Figure 8A:
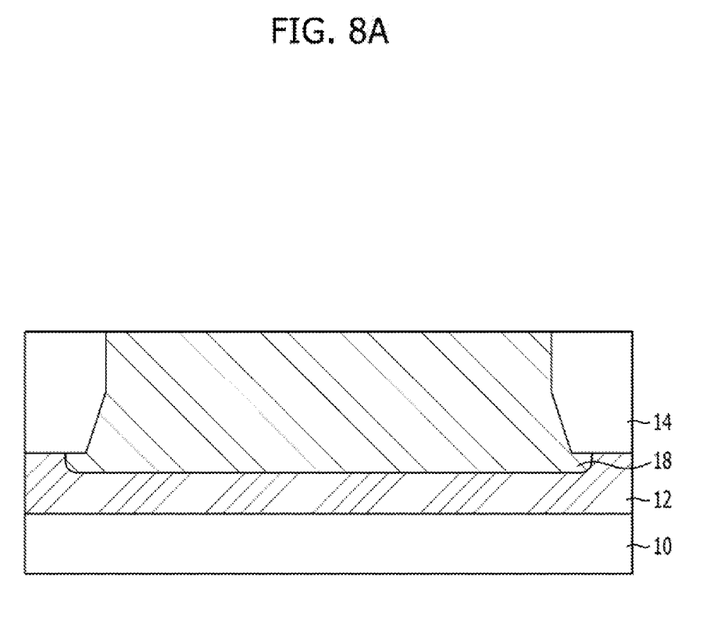
FIGS. 8A to 8D are cross-sectional views illustrating a method for fabricating the non-volatile memory device in accordance with the embodiments of the present invention.

Referring to FIGS. 7A and 8A, a substrate 10 is prepared. A semiconductor substrate may be used as the substrate 10. The semiconductor substrate may be of a single crystal state and contain a silicon-containing material. That is, the semiconductor substrate may include a single crystal silicon-containing material. For example, the substrate 10 may be a bulk silicon substrate or an SOI substrate.

Although not illustrated, the substrate 10 may include a logic region and a memory region. A CMOS including an NMOS and a PMOS may be formed in the logic region, and the non-volatile memory device in accordance with the embodiments of the present invention may be fabricated in the memory region.

Subsequently, a deep well 12 of a second conductive type is formed in the substrate 10. A first well 16 of a second conductive type and a second well 18 of a first conductive type are formed in the deep well 12. The first well 16 may serve as an active control gate. The first well 16 and the second well 18 may be disposed to be spaced apart from each other with a predetermined gap or adjacent to each other on one side. The deep well 12, the first well 16 and the second well 18 may be formed by ion-implanting an impurity into the substrate 10.

A logic well may be formed in the logic region simultaneously while the deep well 12, the first well 16 and the second well 18 are formed.

An isolation layer 14, which is formed in the substrate 10 and defines a plurality of active regions, is formed. Specifically, the isolation layer 14 which defines a first active region and a second active region respectively corresponding to the first well 16 and the second well 18 is formed. The isolation layer 14 may be formed through an STI process. The STI process indicates a process by which an isolation trench is formed by selectively etching the substrate 10 and gap-filling the isolation trench with an insulation material.

Figure 7B:
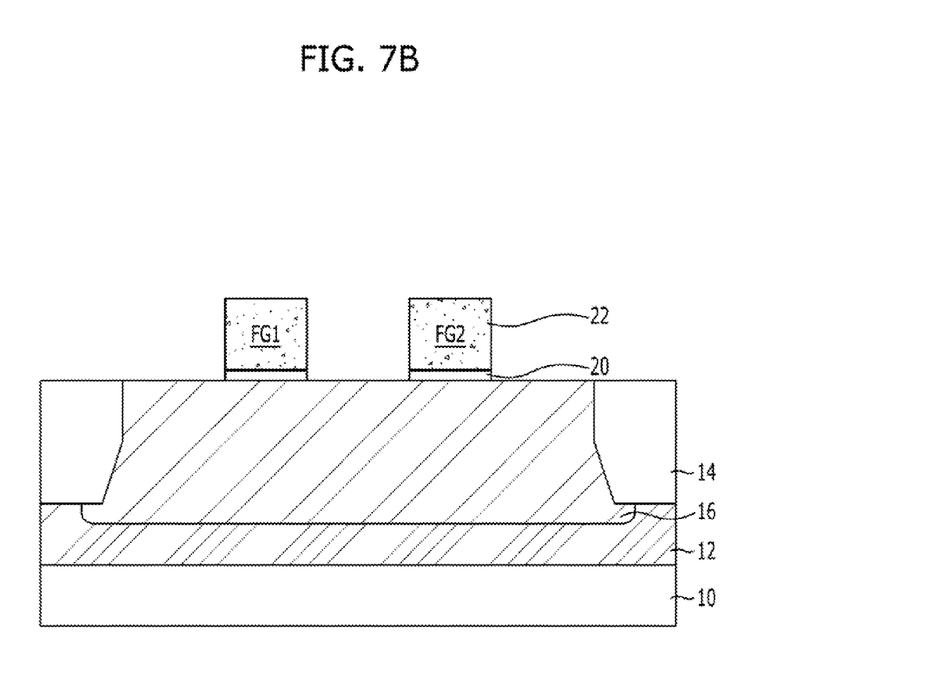
Figure 8B:
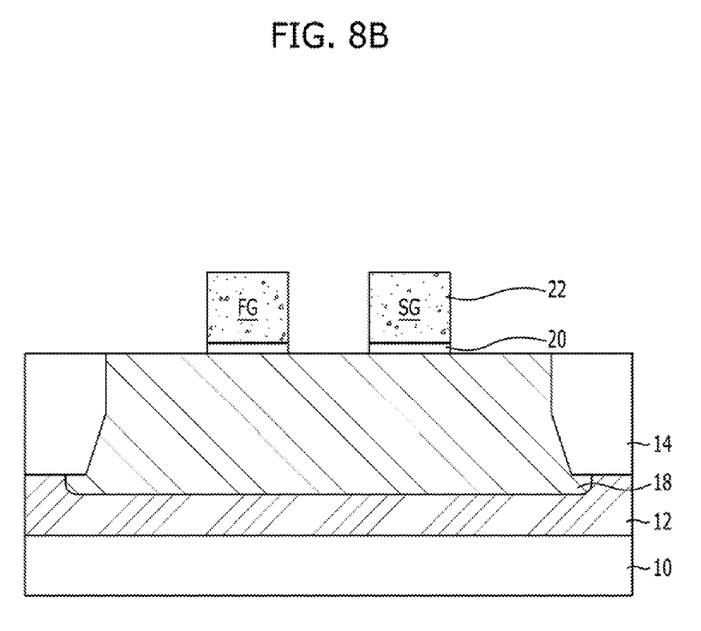

Referring to FIGS. 7B and 8B, a stacked layer in which a gate insulation layer 20 and a gate conductive layer are sequentially stacked is formed over the substrate 10. Subsequently, a gate structure in which the gate insulation layer 20 and a gate electrode 22 are stacked by selectively etching the stacked layer, is formed. Specifically, a floating gate FG of multi-finger type having a plurality of fingers FG1 and FG2 is formed over the substrate 10, and simultaneously a selection gate SG is formed. The floating gate FG may be formed to overlap with the first and second wells 16 and 18, and the fingers FG1 and FG2 may be formed to overlap with the first well 16. The selection gate SG may be formed to overlap with the second well 18 and to be spaced apart from the floating gate FG with a predetermined gap.

A logic gate, e.g., an NMOS gate, a PMOS gate, etc., may be formed in the logic region simultaneously while the floating gate FG and the selection gate SG are formed.

Figure 7C:
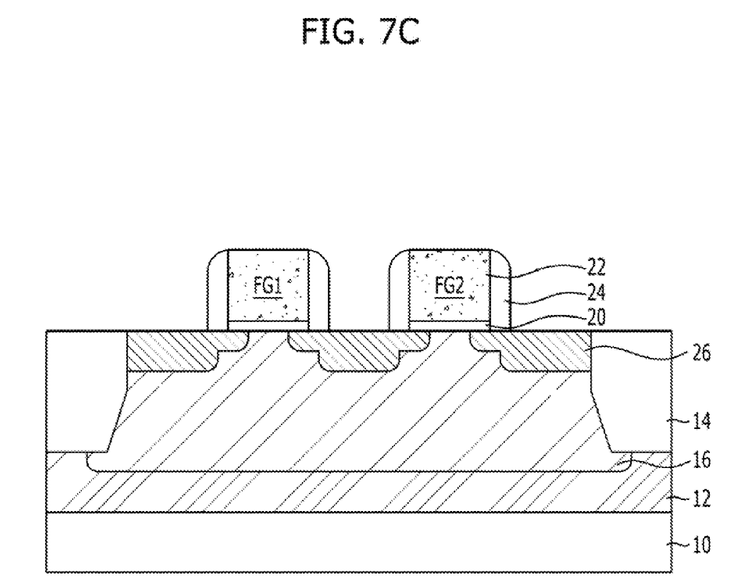
Figure 8C:
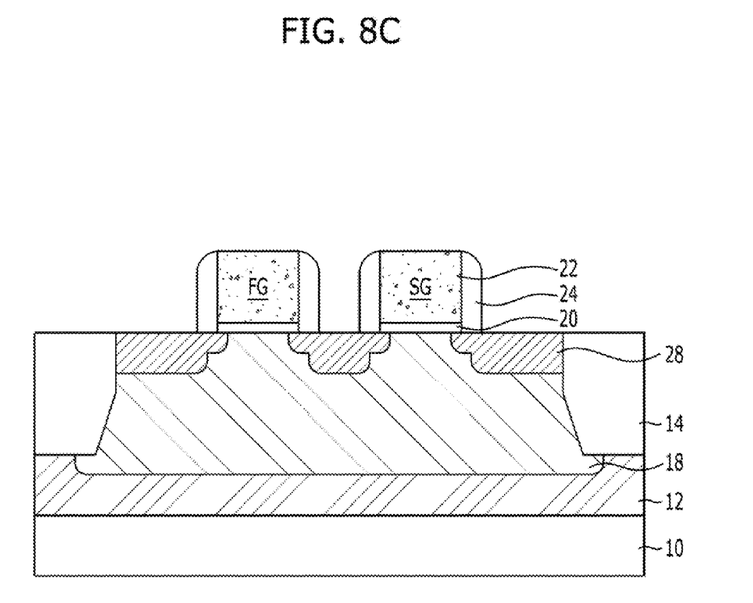

Referring to FIGS. 7C and 8C, sidewall spacers 24 are formed on the sidewalls of the floating gate FG and the selection gate SG. The sidewall spacers 24 formed on the sidewalls of the floating gate FG, particularly, the fingers FG1 and FG2, may serve as a charge blocking layer. The sidewall spacers 24 may be formed of a single layer selected from the group consisting of insulation layers, e.g., an oxide layer, a nitride layer and an oxynitride layer, or a stacked layer thereof. The sidewall spacers 24 may be formed through a surface etch process, e.g., a series of processes including an etch-back process after the insulation layer is formed following the surface of the structure including the floating gate FG and the selection gate SG.

The sidewall spacers 24 may be formed on the sidewalls of the logic gate of the logic region simultaneously while the process for forming the sidewall spacers 24 is performed.

A first impurity region 26 of a first conductive type is formed in the first well 16 exposed by the fingers FG1 and FG2. A second impurity region 28 of a second conductive type is formed in the second well 18 exposed by the floating gate FG and the selection gate SG. The first impurity region 26 and the second impurity region 28 may be formed through an ion-implantation process. The first impurity region 26 and the second impurity region 28 may be formed to have LDD structures.

A junction region and a pick-up region including a source region and a drain region may be formed in the logic region simultaneously while the first impurity region 26 and the second impurity region 28 are formed.

Figure 7D:
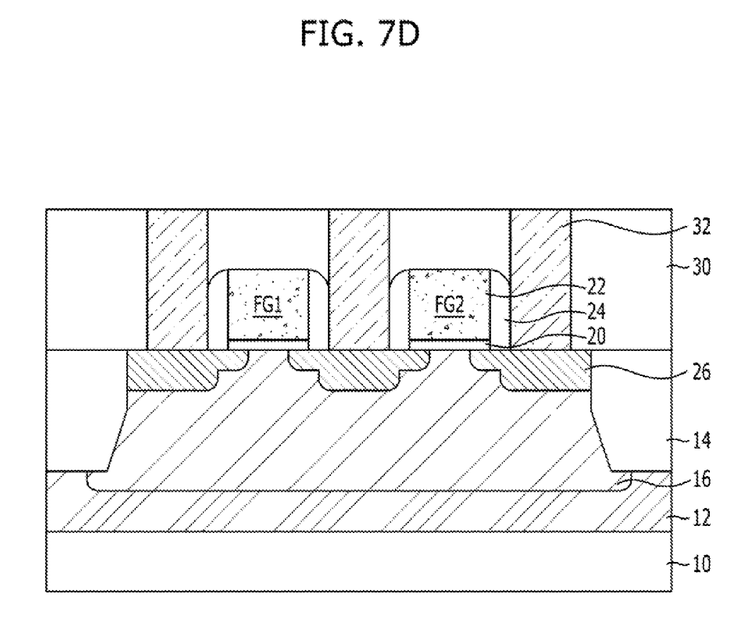
Figure 8D:
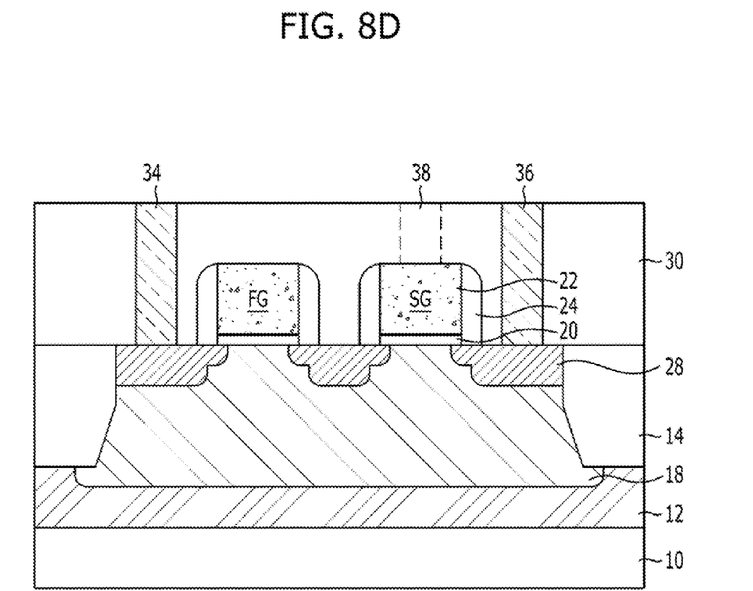

Referring to FIGS. 7D and 80D, an inter-layer insulation layer 30 is formed over the substrate 10. The inter-layer insulation layer 30 may be formed of a single layer selected from the group consisting of an oxide layer, a nitride layer and an oxynitride layer, or a stacked layer thereof.

A plurality of control plugs 32 are formed to be disposed adjacent to the first impurity region 26 by penetrating the inter-layer insulation layer 30. A first contact plug 34 which is coupled with the second impurity region 28 disposed adjacent to the floating gate FG, a second contact plug 36 which is coupled with the second impurity region 28 disposed adjacent to the selection gate SG, and a third contact plug 38 which is coupled with the selection gate SG are formed. After a contact hole is formed by selectively etching the inter-layer insulation layer 30, and a conductive material is formed over the substrate so as to gap-fill the contact hole, the plug structures may be formed through a series of processes including a planarization process which are performed until the inter-layer insulation layer 30 is exposed. The plug structures may be formed in the logic region simultaneously while the plug structures are formed in the memory region.

Although not illustrated, lines are formed to contact each of the plugs. Subsequently, the device may be completed by using widely-known semiconductor fabrication technology.

As described above, the non-volatile memory device in accordance with the embodiments of the present invention may be fabricated through a predetermined logic process. That is, the memory device may be fabricated without an additional process. Consequently, the non-volatile memory device may be easily applied to an embedded memory, may have great logic compatibility, and may improve its productivity.

In accordance with the embodiments of the present invention, since a non-volatile memory device includes a first coupling unit having an active control gate by which an electric field applies to a floating gate in a vertical direction and a second coupling unit having a plurality of control plugs by which an electric field applies to the floating gate in a horizontal direction, a coupling ratio that the device requires may be secured in a minimum area. As a result, the integration degree of the device may improve.

As the coupling ratio that the device requires is secured, a structure, e.g., a well structure, for programming, erasing and reading data may be simplified, and the integration degree of the device may further improve. Also, a variety of operation schemes may be applied, and the operation characteristic may improve.

Furthermore, since the non-volatile memory device is free of a polarity of a bias used for coupling the floating gate as the control unit is formed, the size of a peripheral circuit which applies the bias to memory cells may be reduced, and widely-know diverse operation schemes may be easily applied.

Therefore, the non-volatile memory device may be fabricated through a predetermined logic process without an additional process. Accordingly, the non-volatile memory device may be easily applied to an embedded memory, may have great logic compatibility, and may improve its productivity.

While the present invention has been described with respect to the specific embodiments, it should be noted that the embodiments are for describing, not limiting, the present invention. Further, it should be noted that the present invention may be achieved in various ways through substitution, change, and modification, by those skilled in the art without departing from the scope of the present invention as defined by the following claims.

What is claimed is:

1. A non-volatile memory device, comprising:
   a first well of a second conductive type, which is formed in a substrate;
   a second well, which is formed in the substrate and has a first conductive type in a complementary relationship to the second conductive type;
   a floating gate extended in a first direction, which is formed over the substrate and overlaps with the first and second wells, wherein the floating gate includes a plurality of fingers overlapping with the first well;
   a selection gate, which is formed over the substrate and overlaps with the second well;
   a plurality of control plugs extended in a first direction, which are formed over the first well and disposed adjacent to the fingers with gaps between them;
   sidewall spacers, which are formed on the sidewalls of the floating gate and the selection gate and gap-fill the gaps; and
   an impurity region of a second conductive type, which is formed in the first well below the control plug and electrically connects the control plug to the first well.

2. The non-volatile memory device of claim 1, wherein each of the control plugs has one or more sidewalls facing the fingers.

3. The non-volatile memory device of claim 1, wherein the impurity region overlaps with the floating gate.

4. The non-volatile memory device of claim 1, wherein, when a first bias of a first polarity is applied to the control plug, the same bias as the first bias is applied to the first well and the impurity region.

5. The non-volatile memory device of claim 4, wherein, when a second bias of a second polarity, which is contrary to the first polarity, is applied to the control plug, the same bias as the second bias is applied to the impurity region, and the first well floats.

* * * * *